United States Patent [19]

Schenck

[11] Patent Number: 5,118,971
[45] Date of Patent: Jun. 2, 1992

[54] ADJUSTABLE LOW NOISE OUTPUT CIRCUIT RESPONSIVE TO ENVIRONMENTAL CONDITIONS

[75] Inventor: Stephen R. Schenck, McKinney, Tex.

[73] Assignee: Texas Instruments Incorporated, Dallas, Tex.

[21] Appl. No.: 758,701

[22] Filed: Sep. 9, 1991

Related U.S. Application Data

[60] Continuation of Ser. No. 565,006, Aug. 9, 1990, abandoned, which is a division of Ser. No. 213,060, Jun. 29, 1988, Pat. No. 4,959,563.

[51] Int. Cl.⁵ .................. H03K 17/16; G06F 7/38
[52] U.S. Cl. .................................. 307/443; 307/451; 307/465; 307/468; 307/542; 307/263; 307/202.1
[58] Field of Search .............. 307/443, 451, 465, 468, 307/542, 262, 263, 202.1

Primary Examiner—Stanley D. Miller
Assistant Examiner—Margaret Rose Wambach
Attorney, Agent, or Firm—B. Peter Barndt; Richard Donaldson; William E. Hiller

[57] ABSTRACT

An output circuit is provided which contains voltage control circuitry (14) which drives the gates of the output transistors (18, 20) such that the change in current remains relatively constant. The desired voltage output of the voltage control circuitry (14) can be implemented for a CMOS device using N channel and P channel transistors having their gates connected to $V_{cc}$ and ground respectively. The amount of current control may be adjusted to compensate for environmental conditions such as temperature or voltage supply either dynamically or prior to use.

6 Claims, 2 Drawing Sheets

ADJUSTABLE LOW NOISE OUTPUT CIRCUIT RESPONSIVE TO ENVIRONMENTAL CONDITIONS

This application is a continuation of application Ser. No. 07/565,006 now abandoned (which is a divisional of 07/213,060 filed Jun. 29, 1988 now U.S. Pat. No. 4,959,563 filed Aug. 9, 1990.

RELATED APPLICATION

"LOW NOISE OUTPUT CIRCUIT", by Stephen Robert Schenck, filed concurrently herewith, Ser. No. 213,002 allowed U.S. Pat. No. 4,924,120.

TECHNICAL FIELD OF THE INVENTION

This invention pertains in general to integrated circuits, and more particularly to an output circuit reducing inductive voltage spikes.

BACKGROUND OF THE INVENTION

Advancement in the integrated circuit technology has lead to vast improvements in the speeds of integrated circuits, i.e., the time in which the output of a circuit reacts in response to a new input. Increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents create serious problems. The package holding the integrated circuit includes metallic leads which allow interconnection of integrated circuit devices on a circuit board. Each lead has a small inductance associated with it. The leads are connected to the integrated circuits using bonding wire, which also has an inductance associated with it. Voltage is related to inductance and the time rate of change of current by the equation: $E = L \cdot di/dt$, where L is the measure of inductance, and $di/dt$ is the change in current with respect to time. The abrupt transition of output current creates a large change of current at the ground and power supply leads and in the bonding wire, resulting ground and power supply voltage spikes. These voltage spikes affect the voltages of the devices, and cause output ringing, ground bounce, and false signals.

The drive capability of output circuits is measured by the DC output current which can be sourced or sunk by the output at specific voltages. The circuit must meet this current under worst case conditions which are usually low supply voltage, high temperature, weak device models. A problem with standard circuit designs is that the output must also not generate too large a $di/dt$ under best case conditions, which are high supply voltage, low temperature, strong device models. The result is that with very fast technologies the output $di/dt$ must be adjusted carefully under best case conditions to minimize voltage shift while output speed is characterized under worst case conditions and the product speed will be judged by the worst case numbers. The difference between these is typically a factor of four in timing. The amount of current which MOS circuits can conduct is limited by this $di/dt$ characteristic and reduces the applications where MOS can be used. As technologies get faster, the ability to get signals off the chip and onto the circuit board with as much speed as possible will be even more important, but the rated speed cannot be as fast as the package will allow due to the shift in performance experienced by the devices used to drive the output when the voltage and temperature are at extremes.

To some extent, the problem may be alleviated by reducing the inductance (L) present at the leads, for example, by providing multiple power supply and ground leads. However, the reduction in inductance is often insufficient to eliminate voltage spikes at the output of many devices, and may necessitate using a large package to carry the same integrated circuit.

Another solution attempts to reduce the effect of the voltage spikes by providing a plurality of output transistors which are turned on sequentially such that the circuit provides a plurality of smaller current spikes rather than one large current spike. However, by increasing the number output transistors, the layout of the circuit is much more difficult.

From the foregoing, it may be seen that a need has arisen for a technique which produces an output transistor having a constant change of output current with respect to time in response to switching output voltage states.

SUMMARY OF THE INVENTION

In accordance with the present invention, an output circuit is provided which substantially reduces the switching problems associated with prior output circuits.

In a first aspect of the present invention, a voltage control circuit is used to drive the output transistors such that the ground current has a steady rise time, rather than an abrupt transition. For a MOS or CMOS output circuit, the voltage control circuitry controls the current through the MOS output transistors by controlling the voltage at their gates. The voltage control circuit can be adjusted either dynamically (during operation of the device) or prior to use in a circuit, typically to compensate for fabrication variations between slices. The output circuit of the present invention provides the technical advantage of accurate control of the output current over a wide range of environmental conditions.

In a second aspect of the present invention, the voltage control circuit comprises a plurality of N channel and P channel transistors. The transistors may be selectively enabled to accommodate the amount of $di/dt$ control desired. A logic circuit is provided to enable or disable particular transistor due to environmental conditions, such as temperature, to allow the circuit to operate a maximum performance. Alternatively, the transistors may be enabled after testing the device to compensate for processing variations. This aspect of the invention allows a particular chip or series of chips to be customized for a particular application, or to compensate for processing variations between slices.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The preferred embodiments of the present invention are best understood by referring to FIGS. 1-4 of the drawings, like numerals being used for like and corresponding parts of the various drawings.

Figure 1A:
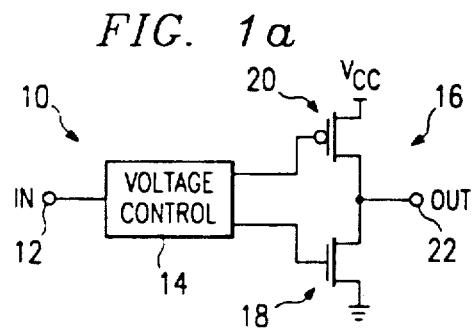
FIGURE 1a illustrates a block diagram of the output circuit of the present invention.

FIGURE 1a illustrates a block diagram of the output circuit 10 of the present invention. The output circuit 10 receives input signals at an input node 12 which is connected to voltage control circuitry 14. The voltage control circuitry 14 is connected to the output transistor 16, shown in the illustrated embodiment of FIG. 1 as a CMOS output transistor comprising an N channel transistor 18 and a P channel transistor 20. The output of the voltage control circuitry 14 is connected to the gates of the N channel and P channel transistors 18 and 20. The source of the P channel transistor 20 is connected to the power supply ($V_{cc}$) and the drain of the P channel transistor 20 is connected to the drain of the N channel transistor 18. The source of the N channel transistor 18 is connected to ground. The output node 22 is connected to the node connecting the drain of the N channel transistor 18 and the drain of the P channel transistor 20.

As is known, the voltage on a gate of a MOS transistor produces a channel below the gate through which current can pass between the source and drain. The thickness of the channel may be controlled by the magnitude of the gate voltage, and consequently, the current between source and drain may be controlled by varying the gate voltage.

In a typical output circuit, a transition from a logical high voltage (normally the supply voltage, $V_{cc}$) to a logical low voltage (normally ground) results in similar transition at the gates of the P channel and N channel output transistors 18 and 20. Hence, the transistors are turned on or turned off fully, resulting in a large current flowing through the power supply pin or the ground pin. The abrupt change in current results in a large di/dt, causing an inductive voltage at the pin. It should be noted that the inductive voltage is related to the change in current, and not the magnitude of current.

Figure 1B:
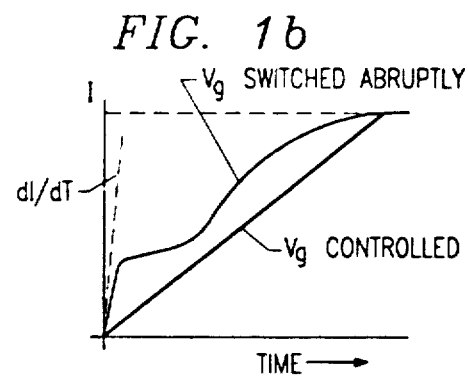
FIGURE 1b illustrates a graph contrasting a large change in current in response to a voltage transition with a small change in current.

As illustrated in FIGURE 1b, the current through a transistor which is switched abruptly between logic levels results in an initial surge of current creating a high di/dt which levels off to a maximum current through the transistor. By controlling the gate voltage of the transistor, di/dt may be maintained as a constant. The current switches from zero to full current in the same time period; however, without an initial current surge, di/dt is greatly reduced.

The equation for drain current of a MOS transistor in the saturated region, where an output drive device is biased as it is turned on by the increase in $V_{gs}$ is as follows:

$$I_d(t) = K' \cdot W/L_g \cdot (V_{gs}(t) - V_t)^2 \quad (1)$$

Where
$I_3$ = the current from source to drain
$K'$ = MOS transistor strength coefficient
$W$ = width of the diffused region
$L_g$ = gate length
$V_{gs}(t)$ = voltage between gate and source as a function of time
$V_t$ = threshold voltage of the transistor The derivative of this equation is:

$$dI_d(t)/dt = 2 \cdot K' \cdot W \cdot L_g \cdot (V_{gs}(t) - V_t) \cdot d(V_{gs}(t) - V_t)/dt \quad (2)$$

During switching, it is desirable that the inductive voltage across the package pin inductor follows the equation:

$$V(t) = L \cdot dI_d(t)/dt \quad (3)$$

where L is the inductance of the pin inductor.

In order to minimize the voltage across the pin inductor, it is necessary to control the di/dt term. In the best case, di/dt is constant during the turn-on of the output transistor. By setting $dI_d(t)/dT$ equal to a constant in equation (2), the equation can be simplified as:

$$D = (V_{gs}(t) - V_t) \cdot d(V_{gs}(t) - V_t)/dT \quad (4)$$

where D is a constant
The solution for $(V_{gs}(t) - V_t) > 0$ is:

$$(V_{gs}(t) - V_t) = C \cdot t^{1/2}. \quad (5)$$

where C is a constant.

Therefore, if $(V_{gs}(t) - V_t)$ increases proportional to the square root of the time after $V_{gs}$ passes the $V_t$ of the transistor, a constant di/dt will be achieved.

Figure 2A:
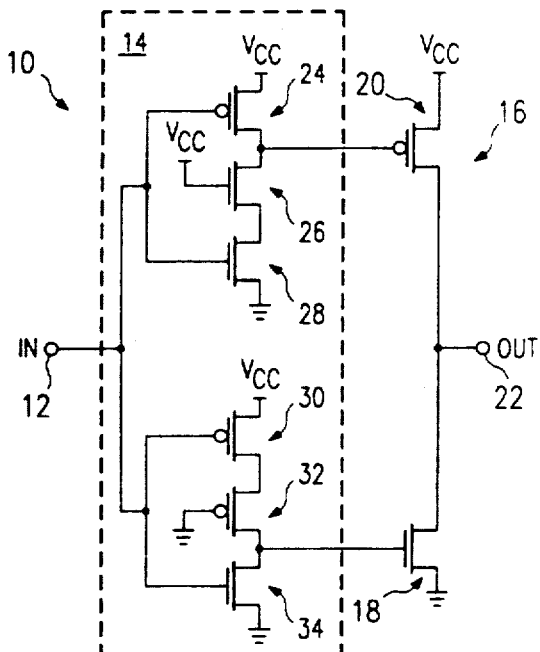
FIG. 2a illustrates a circuit diagram of a first embodiment of the present invention.

FIG. 2a illustrates a circuit which implements the voltage control circuitry 14 of the present invention. The voltage control circuitry 14 comprises a P channel transistor 24 having its source connected to $V_{cc}$, its gate connected to the input node 12 and a drain connected to the gate of the P channel output transistor 20. N channel transistor 26 has its drain connected to the drain of the P channel transistor 24 and a gate connected to $V_{cc}$. An N channel transistor 28 has its drain connected to the source of the N channel transistor 26, a gate connected to the input node 12 and a source connected to ground.

A P channel transistor 30 has a source connected to $V_{cc}$, and a gate connected to the input node 12. A P channel transistor 32 has a source connected to the drain of the P channel transistor 30, a gate connected to ground, and a drain connected to the gate of the N channel output transistor 18. An N channel transistor 34 has a drain connected to the drain of the P channel transistor 32, a gate connected to the input node 12, and a source connected to ground.

It is believed that the circuit of FIG. 2 controls the di/dt in the output transistor 16 because of the time constant associated with the capacitance between the gate and source of the P channel transistor 32 in series with the time constant associated with the capacitance between the gate and source of the N channel output transistor 18. Likewise, the gate voltage of the P channel transistor 20 is controlled in the desired fashion due to the time constants associated with the gate to source capacitances of the N channel transistor 26 and the P channel output transistor 20.

The relative size of the transistors in the output circuit 10 are important to the control of di/dt. A simulation of the response of the output circuit 10 to a change in the logic levels at the input node 12 is shown in FIG.

2b. For purposes of the simulation, the sizes of the various transistors are as given in TABLE 1.

TABLE 1

| TRANSISTOR REFERENCE NUMBER | WIDTH (μm) | LENGTH (μm) |
|---|---|---|
| 18 | 420 | 1.2 |
| 20 | 900 | 1.2 |
| 24 | 100 | 1.2 |
| 26 | 100 | $L_g$ |
| 28 | 43.25 | 1.2 |
| 30 | 43.25 | 1.2 |
| 32 | 43.25 | $L_g$ |
| 34 | 33.25 | 1.2 |

Figure 2B:
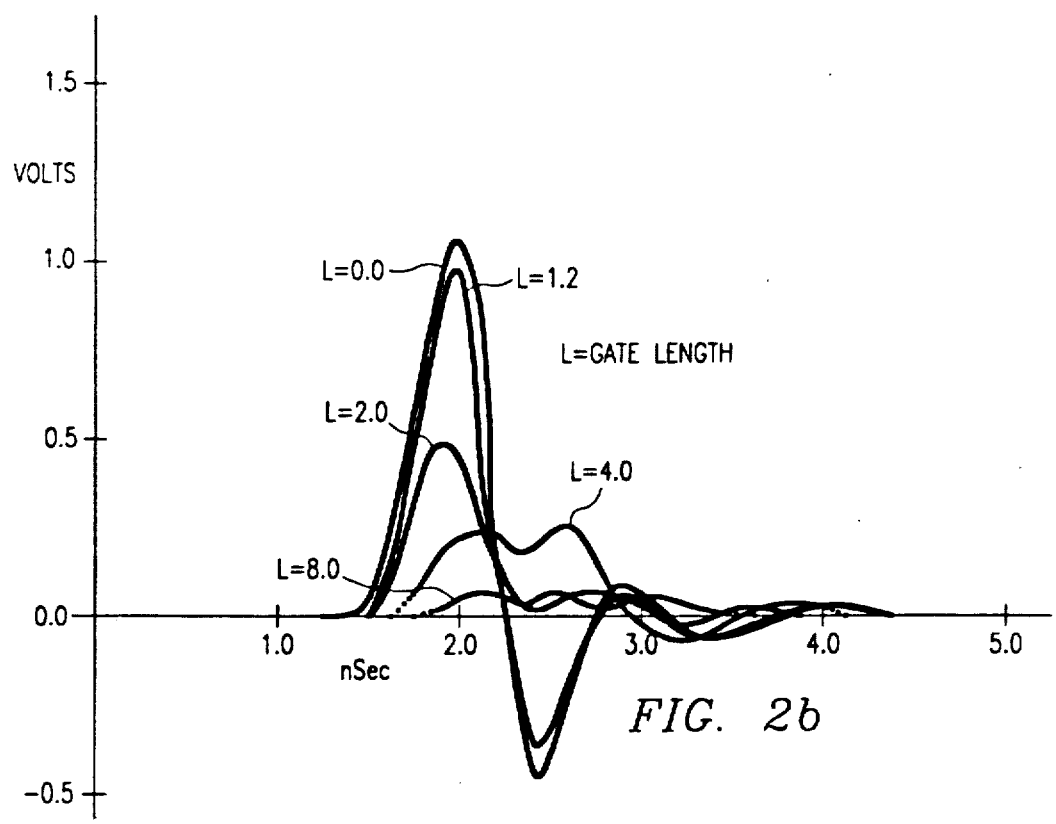
FIG. 2b illustrates a graph showing the inductive voltage attributable to the output circuit of the present invention as a function of gate length.

FIG. 2b illustrates the inductive voltage generated by the output circuit 10 during a transition in the input voltage for various lengths of the N channel transistor 26 and P channel transistor 32. This test was performed with a 50 picofarad capacitor connected to the drain of the N channel transistor 18 to simulate a load capacitance of the ground pin. An inductor was connected in series between chip ground and power supply ground to simulate package inductance. The voltage across the inductor is directly related to di/dt. As can be seen, by increasing the gate length of the transistors 26 and 32, the output transistors 20 and 18 are driven to more closely conform to the ideal voltage curve for minimizing di/dt. It should be noted that for Lg 8.0, the voltage across the inductor is much smaller and constant for approximately one nsec, except for ringing due to the interaction between the chip capacitance and the inductor.

Figure 3A:
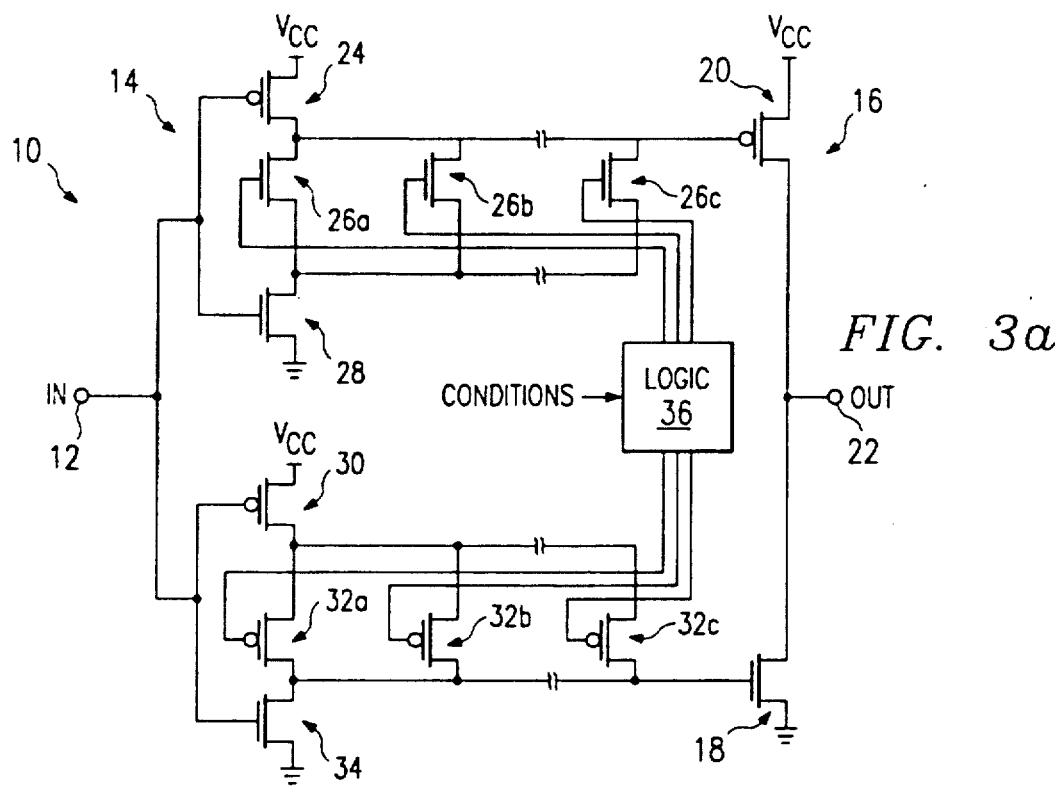
FIGS. 3a-b illustrate circuit diagrams of embodiments of the present invention h programmable control of the output circuits.
Figure 3B:
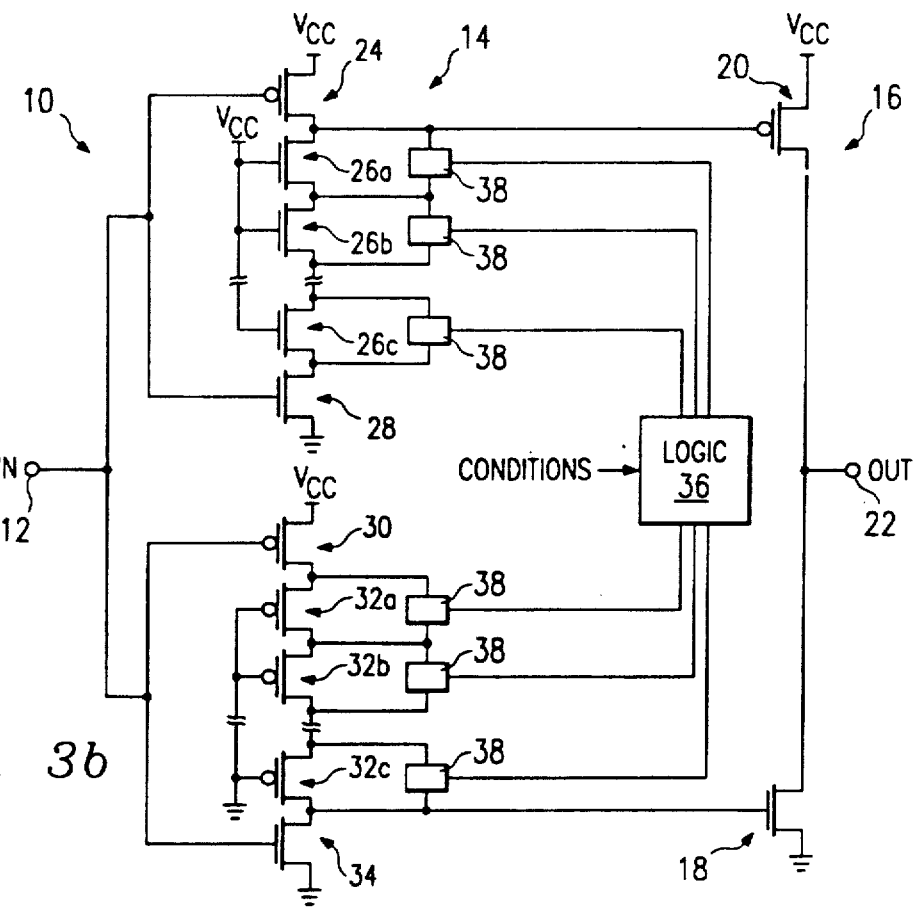

FIGS. 3a-b illustrate alternative embodiments of the output circuit 10 which utilize the variance of di/dt control with respect to the length of the transistor gates. These alternative embodiments allow a circuit to be customized, either under programmable control during operation of the circuit or in custom design of an integrated circuit to specifications.

In FIG. 3a, the N channel transistor 26 and P channel transistor 32 have been replaced by a plurality of transistors 26a-c and 32a-c connected with their sources and drains in parallel, respectively. Although each transistor 26 and 32 has been replaced by three transistors in FIG. 3a, the number of transistors used in an actual application could vary depending upon the amount of control desired. The gates of the transistors 26a-c and 32a-c are connected to logic circuitry 36, which is operable to independently enable the transistors 26a-c and 32a-c. By grounding the N channel transistors 26a-c or connecting the P channel transistors 32a-c to V$_{cc}$, the logical circuitry 36 may disable transistors, thereby effectively removing them from the circuit. Thus, the effective width of the transistor may be adjusted by enabling the desired number of transistors 26a-c and 32a-c. By adjusting the effective gate width, the amount of di/dt control, i.e., the magnitude of di/dt, may be adjusted. Adjusting the gate length has the effect of modifying the slope of the line shown in FIGURE 1b, the greater the gate length, the smaller the slope. Hence, the logic circuitry 36 may adjust to environmental conditions, such as temperature and variations in supply voltages during the operation of the circuit.

For purposes of this specification the "environment" of the output circuit includes changing conditions such as temperature and supply voltage, as well as fixed conditions such as processing variations.

An alternative programmable embodiment of the output circuit is illustrated in FIG. 3b, wherein the transistors 26a-c and 32a-c are connected in series, rather than in parallel. In this embodiment, the transistors 26a-c and 32a-c are disabled by shorting the source and drain of an unwanted transistor, shown schematically by switch boxes 38. Alternatively, the source and drain of each transistor 26a-c and 32a-c could be connected by a fusible link. The fusible link could be opened by applying a predetermined voltage to the link. In either case, the output circuit could be customized to conform to desired specifications; however, by using the logic circuitry 36 the output circuit could dynamically adjust to environmental operating conditions.

The output circuit of the present invention provides the technical advantage that the di/dt may be accurately controlled. Voltage control circuitry which is fairly stable in response to temperature variations can be implemented with MOS circuitry. By using multiple transistors, the output circuit may be customized to desired specifications by enabling and disenabling certain transistors to adjust the effective gate length of the transistors. Furthermore, the transistors may be enabled or disabled during operation to adjust to environmental conditions.

Although the present invention has been described in detail, it should be understood that various changes, substitutions and alterations can be made herein without departing from the spirit and scope of the invention as defined by the appended claims.

What is claimed is:

1. A method of reducing inductive voltage spikes in an integrated circuit caused by an output change in current by an output transistor, comprising the steps of:
   sensing environmental conditions affecting the output transistor
   receiving an input voltage transition;
   providing a driving circuit having a plurality of transistors connected to the output transistor, the transistors being selectively removable from the driving circuit; and
   driving the output transistor in response to said input voltage transition and said environmental conditions by selectively removing ones of the plurality of transistors from the driving circuit in response to said environmental conditions, such that a constant change in current with respect to time is achieved.

2. The method of claim 1 and further comprising the step of defining a desired magnitude of said constant change in current with respect to time.

3. The method of claim 2 and further comprising the step of adjusting the voltage driving said output transistor to compensate for changing environmental conditions.

4. The method of claim 1 wherein said step of sensing environmental conditions comprises sensing ambient temperature.

5. The method of claim 1 wherein said step of sensing environmental conditions comprises sensing supply voltage.

6. The method of claim 1 wherein said step of sensing environmental conditions comprises sensing processing variations between integrated circuits.

* * * * *